(12) United States Patent
Rohm et al.

(10) Patent No.: US 7,434,675 B1
(45) Date of Patent: Oct. 14, 2008

(54) FACILITY FOR FITTING COMPONENT CARRIERS WITH ELECTRIC COMPONENTS

(75) Inventors: Rainer Rohm, Munich (DE); Peter Mison, Singapore (SG)

(73) Assignee: Siemens Aktiengesellschaft, Munich (DE)

( * ) Notice: Subject to any disclaimer, the term of this patent is extended or adjusted under 35 U.S.C. 154(b) by 0 days.

(21) Appl. No.: 09/554,294

(22) PCT Filed: May 7, 1999

(86) PCT No.: PCT/DE99/01394

§ 371 (c)(1),
(2), (4) Date: Jan. 30, 2001

(87) PCT Pub. No.: WO99/59389

PCT Pub. Date: Nov. 18, 1999

(30) Foreign Application Priority Data

May 11, 1998 (DE) ................................ 198 21 033

(51) Int. Cl.
*H05K 13/04* (2006.01)

(52) U.S. Cl. .............. 198/346.2; 198/369.1; 198/463.3; 198/601; 29/592.1; 29/430

(58) Field of Classification Search .............. 198/346.2, 198/369.1, 463.3, 601
See application file for complete search history.

(56) References Cited

U.S. PATENT DOCUMENTS 4,658,947 A * 4/1987 Welder ..................... 198/346.2
4,783,904 A   11/1988 Kimura
4,867,299 A * 9/1989 Fukuoka et al. ............. 198/435
4,999,578 A * 3/1991 Ohashi et al. ............... 324/754
5,078,257 A * 1/1992 Carter, Jr. ................. 198/369.5
5,145,052 A * 9/1992 Santandrea et al. ........ 198/468.2
5,372,239 A   12/1994 Ueda et al.
6,220,420 B1 * 4/2001 Jan et al. ................... 198/369.1

FOREIGN PATENT DOCUMENTS

| DE | 36 01 699 A1 | 7/1987 |
| DE | 195 21 729 A1 | 12/1995 |
| JP | 4-176528 | 6/1992 |
| JP | 06-144556 | 5/1994 |

OTHER PUBLICATIONS

German translation of Japanese Office Action dated Apr. 17, 2008 in corresponding Japanese Application No. 2000-549077.

* cited by examiner

*Primary Examiner*—Mark A Deuble
(74) *Attorney, Agent, or Firm*—Harness, Dickey & Pierce, PLC

(57) ABSTRACT

In a system for equipping component carriers with electrical components, two feed paths for component carriers that are parallel to one another are provided, one being conducted on a straight line over equipping locations of the system and the other being conducted past the equipping locations. Handover devices with which the component carriers can be arbitrarily switched between the two paths are provided between the equipping locations. As a result thereof, a line, parallel or mixed operation of the system is possible, in adaptation to the component carriers to be equipped.

19 Claims, 2 Drawing Sheets

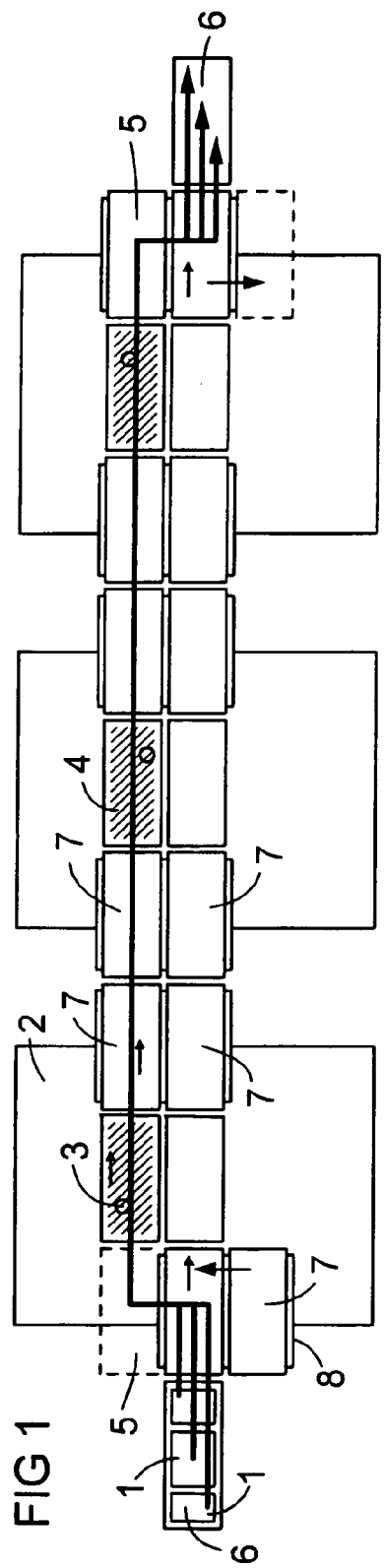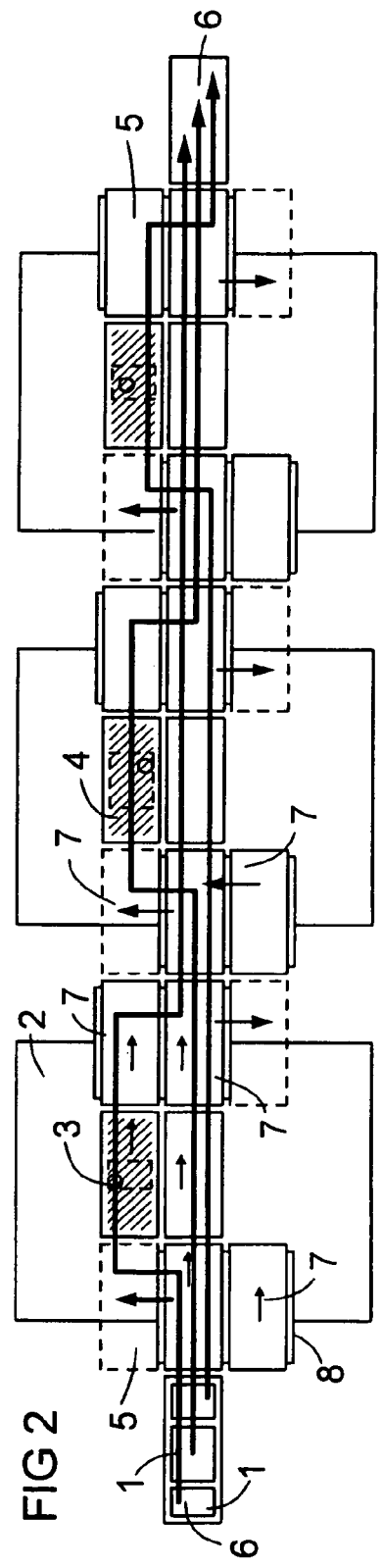

FACILITY FOR FITTING COMPONENT CARRIERS WITH ELECTRIC COMPONENTS

BACKGROUND OF THE INVENTION

The invention is directed to a system for equipping component carriers with electrical components, whereby the system comprises a transport path and at least two equipping locations for the component carriers.

It is generally standard to link a plurality of automatic equipping units having a respective equipping location on the base of a transport path proceeding on a straight line. As a result thereof, it is possible to keep a broad spectrum of different components on hand that are distributed onto the various automatic equipping units. As a result thereof, first assemblies that require a great variety of different components can be completely equipped without delivery modules for the components having to be changed for this purpose. For narrow component carriers, the automatic equipping unit can comprise two transport paths lying in close proximity next to one another with correspondingly two narrow equipping locations lying next to one another on which equipping can be continuously carried out in alternating fashion.

On the other hand, however, it is also possible to equip a plurality of different assemblies having small lot sizes with little refitting expense. However, it can thereby occur that assemblies having a low number of components need only pass through one or a few automatic units in order to be able to be completely equipped. Since these assemblies also pass through the equipping locations that are not required in an approximate clocking, the full scope of their capacity cannot be used.

In standard automatic equipping units, the transport path and the equipping locations overlap. In an automatic equipping unit, it is standard to form the transport path of three sub-transports uncoupled from one another. The equipping location is largely congruent with the middle sub-transport, this being stopped during equipping, whereas, for example, the preceding sub-transport brings the next printed circuit board. Only a simple, linear feed motion is required in order to center the printed circuit board to be equipped in the equipping area.

It is generally standard in assembly technology to conduct transport paths past the work stations and to transfer the workpieces to be processed in at these locations and then out in order to be able to selectively supply the workpieces to the work stations, as a result whereof, however, the time expenditure for the change events is increased.

Such a system has been disclosed, for example, by JP 4 176528 A, in accordance wherewith component carriers are equipped with electrical components with automatic equipping units following one another in a line. The line is subdivided into a plurality of sub-sections each having an equipping path and at least one bypass conveying path that is conducted laterally past the automatic equipping unit. Identical work steps are carried out within the individual equipping paths. Transversely displaceable handover devices that shift the component carriers between the transport paths and equipping paths are arranged between the sub-sections. The individual conveyor belts have detectors allocated to them that control the transport of the component carriers such that these are respectively transferred into a free equipping path. As a result thereof, it is possible to keep continuously operating the system even given the temporary outage of an automatic equipping unit.

In standard automatic equipping units, the transport path and the equipping locations overlap. In an automatic equipping unit, it is standard to form the transport path of three sub-transports uncoupled from one another. The equipping location is largely congruent with the middle sub-transport, this being stopped during equipping, whereas, for example, the preceding sub-transport brings the next printed circuit board. Only a simple, linear feed motion is required in order to center the printed circuit board to be equipped in the equipping area.

SUMMARY OF THE INVENTION

It is an object of the invention, in a system with equipping units linked in series, to be able to produce assemblies with radically different equipping contents given high equipping performance.

This object is achieved by a system for equipping component carriers with electrical components in the system wherein an assembly line comprises a plurality of equipping locations joined to one another for the component carriers. At least one transport path is provided for the component carriers conducted over all of the equipping locations. At least one linear conveying path is provided for the transport of the component carriers that proceeds substantially parallel to the at least one transport path and is conducted past the equipping locations. The assembly line comprises handover devices for transverse transport of the component carriers between the at least one transport path and the conveying path. At least one of the handover devices is arranged between two successive equipping locations as seen in a transport direction. In one setting, each of the component carriers on the transport path is supplied over all equipping locations in direct chaining. In another setting, the assembly line is subdivided into at least two sub-sections at ends of which one of the handover devices is respectively arranged. The component carriers are optionally input into the transport path of one of the two sub-sections or are conducted past the equipping locations on a corresponding section of the conveying path. By providing two paths, it is possible to optionally operate the automatic equipping units in series or parallel without refitting. For example, printed circuit boards for a low number of components can be transferred from the conveying path onto the transport path at an arbitrary location independently from one another and can be returned to the conveying path after passing through the equipping station. As a result thereof, it is possible that a plurality of such assemblies are equipped parallel next to one another without loss of capacity.

As previously, component carriers for a great number of components can travel from equipping location to equipping location with slight change times and a high clock rate and access their supply of components.

However, a mixed mode is also possible wherein, for example, a component carrier passes through only two successive equipping locations. It is also possible to arrange the handover devices preceding or following every second equipping location, as a result whereof that not only the mechanical expense, but also the flexibility as well are reduced.

In a further development of the invention, the components carrier can be switched between the two paths on the basis of simple lateral displacement. It is thereby possible to conduct the conveying path through the automatic equipping units immediately next to the transport path or to also conduct laterally past the automatic equipping unit, a transfer unit having a correspondingly great stroke being required for this purpose.

In another development of the invention, the horizontally lying components carriers can be switched on the basis of a vertical displacement. The structural width of the automatic equipping unit thereby remains correspondingly smaller. For narrow component carriers, two transport paths arranged in close proximity and two correspondingly arranged conveying paths can be provided, as previously. The conveying path can proceed above or below the automatic equipping unit given a transfer unit designed with a great stroke.

In a further development of the invention, a space-saving arrangement of the conveying is provided path. In particular, the arrangement above the automatic equipping units has the advantage that the conveying path can be largely uncoupled therefrom. As a result thereof, the automatic equipping units can advantageously be optionally employed both for the single-track as well as for the two-track mode without modification of their structure.

In a further development of the invention, it is possible to arrange the equipping location at the upper side of the automatic equipping unit in a way that is easily observable and accessible.

In another of the development of the invention, the handover unit is combined with the sub-transport to form a unit that enables a fast and exact transfer of the components carriers.

The handover unit makes it possible to simultaneously insert the two sub-transports into both paths and to operate these simultaneously and independently of one another with the exception of the switching events.

Although the arrangement of the conveying path along the underside of the automatic equipping units requires a great displacement stroke, it makes it possible to use the automatic equipping units, which are only configured for a single-track mode, unmodified. Due to the independence of the displacement drives, it is possible to in turn close the arising gaps in the paths in a short time.

The sub-transports of the invention, require less guidance and drive expense and are particularly suitable for systems having a slight spacing between the two paths.

In another development of the invention, it is possible to integrate the handover unit in the automatic equipping units, so that the lines composed of a plurality of automatic units can be formed by simply joining the automatic equipping units to one another.

The automatic equipping units according to a further development of the invention can be utilized at any desired location of the line, but particularly at the start and end thereof.

The handover unit of the invention also makes it possible to achieve a conveying path outside, particularly under the automatic equipping units.

In another development of the invention, a further enweaving of the transport system with a corresponding simplification of the control unit is provided, as a result whereof, for example, optical sensor devices in the region of the handover unit for distinguishing between completely and incompletely equipped component carriers can be foregone. It is thereby advantageous when the handover unit comprises two independently displaceable sub-transports for both parallel paths.

The system of the invention also makes it possible to conduct the component carrier out of the transport path without changing it relative attitude vis a vis the respective sub-transport. In this time, the arising gap is closed by the other sub-transport for further transport events, whereby the structural expense is reduced.

The conveying path of another development of the invention likewise enables the two-track mode in a space-saving way without having to modify the automatic equipping units for this purpose, which can be particularly realized with the assistance of foot parts.

The arrangement of the invention, in a further development of the invention requires a corresponding structural modification of the previously single-track automatic equipping units. An installation space for the conveying path that can be arranged at relatively close proximity under the transport path must be designed in the chassis thereof, so that the displacement path and the change times can be considerably shortened. Dependent on the customer wishes, such an automatic equipping unit can then be delivered with or without an additional conveying path. It is also easily possible to retrofit an automatic equipping unit that has already been delivered with the conveying path on demand.

The invention is explained in greater detail below on the basis of exemplary embodiments shown in the drawings.

BRIEF DESCRIPTION OF THE DRAWINGS

FIG. 1 is a plan view onto a system for equipping component carriers with electrical components;

FIG. 2 is a plan view onto the system of FIG. 1 in a different setting;

DESCRIPTION OF THE PREFERRED EMBODIMENTS

Figure 3:
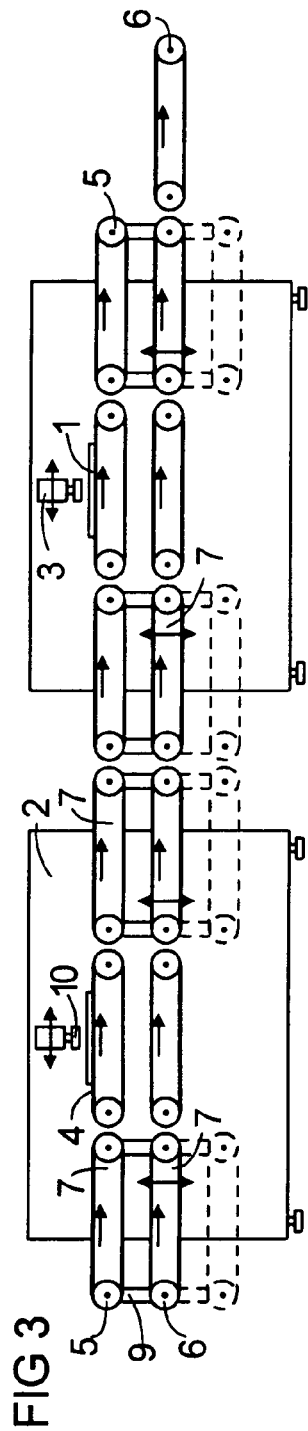
FIG. 3 is a side view of a further system for equipping component carriers.

According to FIG. 1, a system for equipping component carriers 1 comprises three automatic equipping units 2 standing behind one another in a row, an equipping head thereat being movable over an equipping location to which the component carriers 1 can be transported. The system comprises two separate paths lying next to one another for transporting the component carriers 1. One of the paths is designed a transport path 5 that leads over the equipping locations 4 lying in a line following one another. The other path is a pure conveying path 6 that is conducted past the equipping locations 4 immediately next to the transport path 5.

The two paths are subdivided into a plurality of independently drivable sections, whereby the sections lying in front of and behind the equipping location are designed as sub-transports 7 displaceable in the equipping plane transversely relative to the transport direction. Of these, respectively two sub-transports 7 of the transport path 5 and the conveying path 6 lying next to one another are secured on a common carrier 8 that is displaceable transversely to the transport direction by the spacing of the two paths and that forms a handover unit. As a result thereof, it is possible to insert the respective sub-transport allocated to the transport path aligned into the conveying path, as shown at the left end of the conveying path 6.

A component carrier that already resides in the preceding section can then be handed over onto the sub-transport by driving these two sections and can be transferred by retracting the carrier 8 with the two sub-transports into the transport path. In the reverse sequence, such a component carrier can be handed over from the transport path 5 to the conveying path 6, as indicated at the right-hand end of the transport path 5. Such displacement events are possible at all sub-transports, so that the component carriers can be inserted into the transport path at an arbitrary location or, respectively, handed back over to the conveying path.

The motion arrows illustrated in FIG. 1 show the corresponding displacement, drive and transport devices. The various component carriers 1 are already handed over here at the start of the transport path and pass through the individual equipping locations on a direct route, so that corresponding change procedures are omitted.

Given the operating mode shown in FIG. 2, the component carriers 1 are not processed in line, but parallel. The component carriers 1 are thereby completely equipped at only one respective equipping location 4 and are respectively transferred into the transport path 5 before the equipping location 4 and are in turn returned into the conveying path immediately thereafter. This mode is especially suitable for component carriers 1 that have to be equipped with a low number of components.

According to FIG. 3, the transport path 5 is not arranged next to but rather over the conveying path 6. Accordingly, another carrier 9 for respectively two of the sub-transports 7 is displaceable in the vertical direction by the spacing between the two paths. As a result thereof, the component carriers 1 can be transferred between the two paths in alternation, similar to the system according to FIGS. 1 and 2. The free distance between the two paths is approximated here to the maximum height of the equipped component carrier 1, so that the displacement paths are correspondingly short. Given this arrangement, the equipping location 4 is at the upper side of the paths, so that the equipping head 3 can place the components 10 onto the component carrier 1 unobstructed and with good accessibility.

Figure 4:
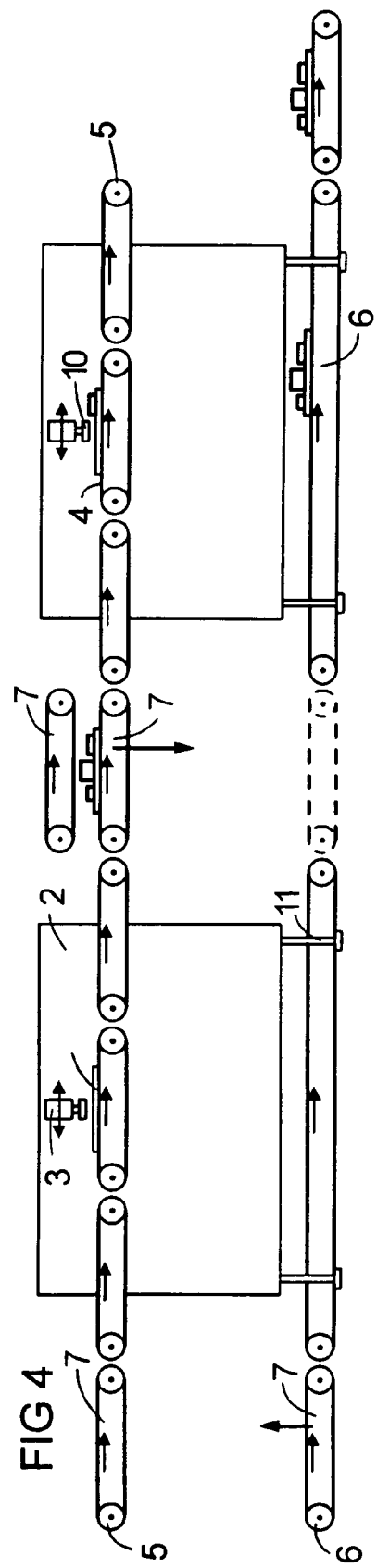
FIG. 4 is a further side view of a different system.

According to FIG. 4, the conveying path 6 proceeds under the automatic equipping units 2, whose foot parts 11 have been correspondingly raised. This has the advantage that the automatic equipping units 2 can remain unmodified. Two additional sub-transports 7 displaceable in height position are arranged between two respectively successive automatic equipping units and are combined to form a structural unit in a way that is not shown in detail. In the normal case, they align with the transport path 5 or, respectively, the conveying path 6, as shown at the left side of the system.

The lower sub-transport 7 is thereby displaceable between the conveying path 6 and the transport path 5 and can thus switch component carriers 1 between these paths. The upper sub-transport 7 is deflected up only to such an extent that enough space remains for the equipped component carrier 1 situated therebelow. These two sub-transports 7 can thus be displaced independently of one another.

We claim as our invention:

1. A system for equipping component carriers with electrical components in a system, comprising:
    an assembly line comprising a plurality of equipping locations joined to one another for the component carriers;
    at least one transport path for the component carriers conducted over all of the equipping locations;
    at least one linear conveying path for the transport of the component carriers that proceeds substantially parallel to the at least one transport path and is conducted past the equipping locations;
    the assembly line comprising handover devices for transverse transport of the component carriers between the at least one transport path and the conveying path;
    at least one of the handover devices being arranged between two successive equipping locations as seen in a transport direction;
    in a first setting, each of the component carriers on the transport path being supplied over all equipping locations in sequence;
    in a further setting the assembly line being subdivided into at least two sub-sections at ends of which one of the handover devices is respectively arranged; and
    the component carriers being input into the transport path of one of the two sub-sections or conducted past the equipping locations on a corresponding section of the conveying path.

2. The system according to claim 1 wherein the transport path and the conveying path are designed as linear transports arranged side-by-side in parallel in a horizontal plane.

3. The system according to claim 1 wherein the transport path and the conveying path that are arranged in parallel lying spaced above one another.

4. The system according to claim 1 wherein the transport path proceeds above the conveying path, and particularly above an automatic equipping unit at an equipping location.

5. The system according to claim 4 wherein the transport path is arranged at a level of the equipping location, and the conveying path proceeds below the transport path.

6. The system according to claim 1 wherein the transport path is subdivided into a plurality of successive sections driven independently of one another; the handover device is allocated to one of the successive sections; and the one of the successive sections is designed as a sub-transport that is displaceable between the two paths.

7. The system according to claim 6 wherein the handover device is formed of two sub-transports that at least temporarily align with the paths.

8. The system according to claim 7 wherein the two sub-transports are displaceable independently of one another.

9. The system according to claim 7 wherein the two sub-transports comprise a fixed spacing from one another and are held on a common carrier displaceable transversely relative to the paths.

10. The system according to claim 1 wherein the equipping locations are arranged in separate automatic equipping units of the system; and
    the handover devices form part of at least one of the automatic equipping units.

11. The system according to claim 10 wherein the automatic equipping unit respectively comprises one of the handover devices before and after the equipping location.

12. The system according to claim 10 wherein the handover device is designed as a separate structural unit that is arranged between the two automatic equipping units.

13. The system according to claim 1 wherein the conveying path is subdivided into two parallel paths proceeding parallel to one another, the one carrying component carriers that are not yet equipped or incompletely equipped and the other carrying component carriers that have already been equipped; and
    in addition to being displaceable in the vertical direction, the handover device is also horizontally displaceable for optional drive of both parallel transport paths.

14. The system according to claim 1 wherein a first sub-transport of the handover devices is displaceable transversely relative to the transport direction;
    a second sub-transport of the handover devices is displaceable in the same direction is arranged in parallel next to said first sub-transport; and
    the two sub-transports, which are driven independently of one another, are directed in alternating fashion in alignment with an adjoining section of the transport path.

15. The system according to claim 14 wherein the two sub-transports are secured on a common carrier that is displaceable transversely relative to the transport direction by a spacing of the two sub-transports.

16. A system for equipping component carriers with electrical components, comprising:

automatic equipping units linked in a line for the component carriers being provided with at least one equipping location;

a transport path for the component carriers in the automatic equipping units proceeding at a height of the equipping location;

a second path for the transport of the component carriers designed as a conveying path that proceeds past the equipping location under the transport path;

the conveying path proceeding under a chassis of the automatic equipping unit; and the chassis comprising an elevating section at least in a region of the conveying path that corresponds to a height of a linear transport plus that of the equipped component carrier.

17. The system according to claim 16 wherein foot parts of the chassis are higher than the linear transport with the equipped component carrier.

18. A system for equipping component carriers with electrical components, comprising:

an assembly line comprising a plurality of equipping locations for the component carriers;

at least one transport path for the component carriers adjacent the equipping locations;

at least one linear conveying path for the transport of the component carriers that proceeds substantially parallel to the at least one transport path and is conducted past the equipping locations;

the assembly line comprising handover devices for transverse transport of the component carriers between the at least one transport path and the conveying path;

at least one of the handover devices being arranged between two successive equipping locations as seen in a transport direction;

in a first setting, each of the component carriers on the transport path being supplied to all equipping locations in sequence;

in a further setting, the assembly line being subdivided into at least two sub-sections at ends of which one of the handover devices is respectively arranged; and the component carriers being input into the transport path of one of the two sub-sections or conducted past the equipping locations on a corresponding section of the conveying path.

19. A method for equipping component carriers with electrical components, comprising the steps of:

providing in an assembly line a plurality of equipping locations joined to one another for the component carriers;

guiding at least one transport path for the component carriers over all of the equipping locations;

guiding at least one linear conveying path for the transport of the component carriers substantially parallel to the at least one transport path and past the equipping locations;

providing handover devices for transverse transport of the component carriers between the at least one transport path and the conveying path;

arranging at least one of the handover devices between two successive equipping locations as seen in a transport direction;

supplying each of the component carriers on the transport path overall equipping locations in sequence;

subdividing the assembly line into at least two sub-sections at ends of which one of the handover devices is respectively arranged; and inputting the component carriers into the transport path of one of the two sub-sections or conducting them past the equipping locations on a corresponding section of the conveying path.

* * * * *